US006232840B1

(12) United States Patent
Teeter et al.

(10) Patent No.: US 6,232,840 B1
(45) Date of Patent: May 15, 2001

(54) TRANSISTOR AMPLIFIER HAVING REDUCED PARASITIC OSCILLATIONS

(75) Inventors: Douglas A. Teeter, Arlington; Aryeh Platzker, Belmont, both of MA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/329,676

(22) Filed: Jun. 10, 1999

(51) Int. Cl.[7] .............................. H03F 3/68; H03F 3/04; H03F 3/14; H01L 29/00
(52) U.S. Cl. .................... 330/295; 330/302; 330/303; 330/307; 257/533
(58) Field of Search .................... 330/295, 302, 330/303, 306, 307; 257/379, 533

(56) References Cited

U.S. PATENT DOCUMENTS

| 3,662,274 | * | 5/1972 | Pritchard et al. | 330/295 |
| 4,901,032 | * | 2/1990 | Komiak | 330/295 |
| 5,111,157 | * | 5/1992 | Komiak | 330/295 |
| 5,805,023 | * | 9/1998 | Fukuden | 330/302 |
| 6,046,641 | * | 4/2000 | Chawla et al. | 330/307 |

OTHER PUBLICATIONS

Platzker's section, "Power Amplifiers: From Milliwatts to Kilowatts . . . Cool Devices with Hot Performance", Short Course Notes, GaAs IC Symposium, Nov. 1999, Atlanta, Georgia.
Nelson's section, "Power Amplifiers: From Milliwatts to Kilowatts . . . Cool Devices with Hot Performance", Short Course Notes, GaAs IC Symposium, Nov. 1999, Atlanta, Georgia.
Balth Van Der Pol, "Forced Oscillations in a Circuit with non–liner Resistance", The London, Edinburgh and Dublin Philosophical Magazine and Journal of Science, Series 7, vol. III, No. 13, Jan. 1927, pp 65–81.
Minorsky, "Nonlinear Oscillations", D. Van Nostrand Company, Princeton, NJ 1962, pp 241 and 469.
Muller et al., "Stability Problems in Transistor Power Amplifiers", Proceedings of the IEEE, Aug. 1997, pp. 1458–1466.
Mumford, "Some Notes on the History of Parametric Transducers", Proceedings of the IRE, May 1960, pp 848–850.

(List continued on next page.)

Primary Examiner—Robert Pascal
Assistant Examiner—Patricia T. Nguyen
(74) Attorney, Agent, or Firm—Daly, Crowley & Mofford

(57) ABSTRACT

A transistor device having a plurality of transistor cells. Each one of the cells has a control electrode for controlling a flow of carriers through a semiconductor. The device has an input node. A plurality of filters is provided. Each one of the filters is coupled between the input node and a corresponding one of the control electrodes of the plurality of transistor cells. In one embodiment of the invention, pairs of the control electrodes are connected to a common region and wherein each one of the filters is coupled between the input node and a corresponding one of the common regions. The semiconductor provides a common active region for the plurality of transistor cells. Each one of the filters comprises: a conductive layer; a dielectric layer disposed on the conductive layer; a resistive layer disposed over the dielectric layer; a conductive electrode disposed in electrical contact with a first portion of the resistive layer and providing the input node; and, a connector in electrical contact with a second portion of the resistive layer such second portion of the resistive layer being displaced from the first portion of the resistive layer, such connector passing through the dielectric and being in electrical contact with the first conductor.

7 Claims, 11 Drawing Sheets

OTHER PUBLICATIONS

Phillips, "Parametric Oscillation in a Damped Resonant System", IEEE Transactions on Circuit Theory, Dec. 1963, pp. 512–515.

Manley et al., "Some General Properties of Nonlinear Elements—Part I. General Energy Relations", Proceedings of the IEEE, Jul. 1956, pp. 904–913.

Penfield et al, "Varactor Applications", The MIT Press, Cambridge, MA 1962.

Imbornone et al., "New Insight Into Subharmonic Oscillation Mode of GaAs Power Amplifiers Under Severe Output Mismatch Condition", 1996 GaAs IC Symposium, pp. 307–310.

Struble et al., "A Rigorous Yet Simple Method For Determining Stability of Linear N–Port Networks", 1993 GaAs I C Symposium, pp. 251–254.

* cited by examiner

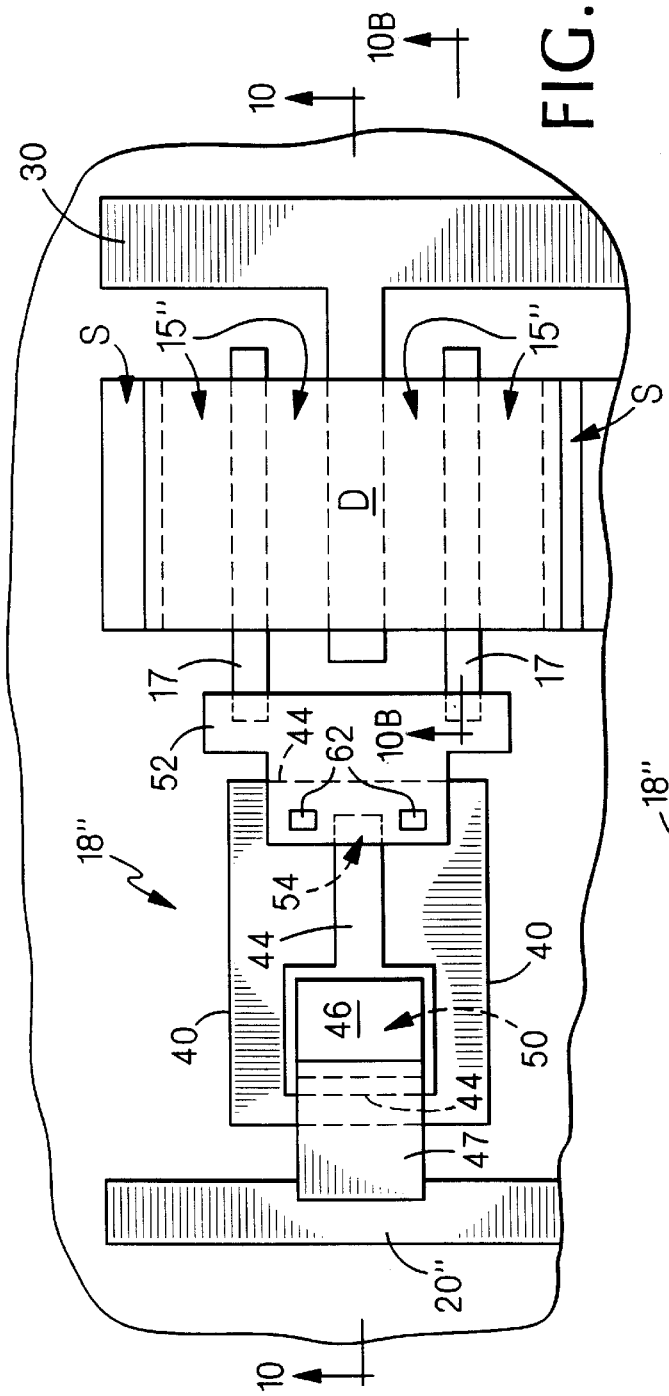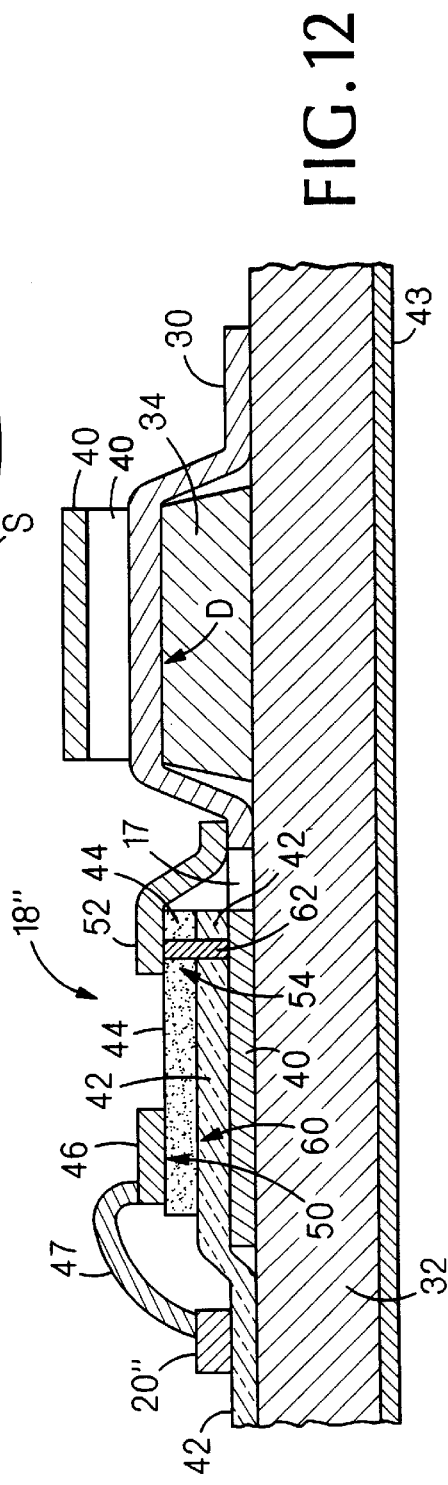

TRANSISTOR AMPLIFIER HAVING REDUCED PARASITIC OSCILLATIONS

STATEMENT REGARDING FEDERALLY SPONSORED RESEARCH

The government has certain rights in the invention pursuant to Contract No. N62269-96-C-0042, awarded by the Deptartment of the Navy.

BACKGROUND OF THE INVENTION

This invention relates generally to transistor amplifiers and more particularly to transistor amplifiers having reduced parasitic, or parametric, oscillations.

As is known in the art, transistor amplifiers, particularly high power pHEMT and HBT power amplifiers, frequently have oscillations that occur only when the amplifier is driven by a large signal. Under small signal conditions these oscillations are usually not present. Such oscillations are sometimes referred to as parametric oscillations since they depend on variations of particular external parameters (bias, frequency, input drive, and temperature). While the amplifier may appear perfectly stable under small signal conditions, oscillations can appear as the amplifier is driven harder. These oscillations tend to be very sensitive to input drive, bias conditions, and operating frequency. FIG. 1 shows a power amplifier 10. The amplifier includes a plurality of transistor devices 12 arranged as shown. Several typical observed oscillations in such type of amplifier 10 are shown in FIGS. 4 through 7. FIG. 4 shows subharmonic f/2 and 3f/2 oscillations. FIG. 5 shows a 200 MHz spurious oscillation that appeared as an amplifier was driven about 0.5 dB into compression. FIGS. 6 and 7 show further examples of troublesome spurious oscillations under power drive. Additional examples may be found in "Power Amplifiers: From Milliwatts to Kilowatts . . . Cool Devices with Hot Performance, " Short Course Notes of Aryeh Platzker's section, 1998 GaAs IC Symposium. Existence of such oscillations can be a major problem in many wide band radar applications, where the oscillation tones could be mistaken for false signals. Elimination of these oscillations is essential for the system to work properly.

One technique commonly used to reduce these parasitic oscillations is to use a parallel R-C filter as presented in "Power Amplifiers: From Milliwatts to Kilowatts . . . Cool Devices with Hot Performance," Short Course Notes Steve Nelson and Aryeh Platzker's section, 1998 GaAs IC Symposium. Thus, referring to FIGS. 1 and 2, the transistor devices 12 in FIG. 1 are replaced with the transistor devices, such as transistor device 12' shown in FIG. 2. Thus, here each device includes a plurality of transistor cells 15, here each a FET, having the gate electrodes G connected to a common node 16. A filter 18, i.e., the R-C network, is connected between an input node 20 and the common node 16. These R-C filters (i.e., networks) 18 are generally placed on the gate manifold (i.e., the common node 16) of the transistor cell 15, as shown in FIG. 2, is somewhat removed from the intrinsic transistor device.

As is also known in the art, drive dependent oscillations were first studied in the 1920s and 30s for tube amplifiers. Van Der Pol first studied how nonlinear resistance can introduce forced oscillations. Reference is made to "Forced Oscillations in a Circuit with Non-Linear Resistance (Reception with reactive Triode)", by Balth Van Der Pol, published by The London, Edinburgh, and Dublin Philosophical Magazine and Journal of Science, series 7, vol. III, no. Jan. 13, 1927, pp. 65–81 and to Nonlinear Oscillations, by Nicholas Minorsky, published by D. Van Nostrand Company, Princeton, N.J. 1962, page 241. Mandlestam and Papalexi further investigated subharmonic oscillations in electron tubes, as reported in Nonlinear Oscillations, by Nicholas Minorsky, published by D. Van Nostrand Company, Princeton, N.J. 1962, page 469.

Over the years, numerous authors have investigated the subject of large signal oscillations. See: Otward Muller and William Figel, "Stability Problems in Transistor Power Amplifiers," Proceedings of the IEEE, Aug. 1967, pp. 1458–1466; W. Mumford, "Some Notes on the History of Parametric Oscillations," Proceedings of the IRE, May 1960, pp 848–850; R. Phillips, "Parametric Oscillation in a Damped Resonant System," IEEE Transactions on Circuit Theory, December 1963, pp. 512–515; J. Manley and H. Rowe, "Some General Properties of Nonlinear Elements—Part 1. General Energy Relations," Proceedings of the IEEE, July 1956, pp. 904–913.

Subharmonic oscillations (f/2, 3f/2, etc.) have been investigated in depth and many parallels to pumped varactor diodes can be made to explain the phenomenon in pHEMT devices. It is well known that a pumped varactor diode gives rise to subharmonic components due to the nonlinear capacitance. See also P. Penfield, Jr. & R. Rafuse, Varactor Applications, The MIT Press, Cambridge, Mass, 1962. To first order, the gate of a FET can be analyzed as a pumped varactor diode; a primary contributor to subharmonic oscillations being the nonlinearity in Cgs and Cgd, where Cgs is the gate to source capacitance and Cgd is the gate to drain capacitance. See also J. Imbornone, M. Murphey, R. Donahue, E. Heaney, "New Insight into Subharmonic Oscillation Mode of GaAs Power Amplifiers Under Severe Output Mismatch Condition," 1996 GaAs IC Symposium, pp. 307–310. A simplified FET model is shown in FIG. 8 and its equivalent input impedance is shown in FIG. 9, where:

G is the gate;
D is the drain;
S is the source;
IDS is the drain to source current;
Rg is the gate resistance;
Cgs is the gate to source capacitance;
Cdg is the drain to gate capacitance; and
Cds is the drain to source capacitance.

Assuming the nonlinear capacitance, C(t), shown in FIG. 3, varies as:

$$C(t) = C_o + C_2 \sin(2\omega_o t)$$

where t is time and the pumping frequency (input drive frequency) is $2\omega_o$, oscillations will arise at half the drive frequency provided $$\left| Z_1 + R_s + \frac{1}{j\omega_o C_o} \right| < \frac{C_o}{C_2^2} \omega_o$$

where $2\omega^o$ is the input signal frequency, $\omega_o$ is the frequency of the f/2 parasitic oscillation, Rs is the series resistance of the diode (analogous to the gate resistance, Rg), Zl is the load impedance seen by the diode at $\omega_o$ (analogous to the impedance looking back from the gate of the FET), $C_o$ is the small signal capacitance, and C2 is the nonlinear component of the varactor capacitance. Despite the oversimplification of this theory, it qualitatively describes the behavior of pHEMT power amplifiers. Subharmonic oscillations will not appear under low drive (C2→0), or if Rs is high enough.

Adding the R-C filter 18 (FIG. 2) increases the input resistance enough at low frequencies to eliminate oscillations under drive.

The subject of spurious parasitic oscillations has been studied less, but is also due to nonlinearities in the transistor. Some insight into spurious parasitic oscillations may be found in the above-mentioned reference by Otward Muller and William Figel. There the authors view the amplifier as the superposition of a nonlinear amplifier and a linear amplifier with the bias point determined by input drive. The nonlinear amplifier causes subharmonic oscillations while linear amplifier component causes spurious oscillations. Driving the device hard results in a negative input impedance which in turn can cause oscillations. The resistance in the R-C filter 18 (FIG. 2) offsets the negative resistance in the device, thereby suppressing any oscillation.

SUMMARY OF THE INVENTION

In accordance with one feature of the invention, a transistor device is provided having a plurality of transistor cells. Each one of the cells has a control electrode for controlling a flow of carriers through a semiconductor. The device has an input node. A plurality of filters is provided. Each one of the filters is coupled between the input node and a corresponding one of the control electrodes of the plurality of transistor cells.

In one embodiment of the invention, pairs of the control electrodes are connected to a common region and wherein each one of the filters is coupled between the input node and a corresponding one of the common regions.

In accordance with another feature of the invention, the semiconductor provides a common active region for the plurality of transistor cells.

In accordance with another feature of the invention, each one of the filters comprises a resistor and a capacitor, the resistor and the capacitor being connected in parallel between the input node and the corresponding one of the control electrodes.

In accordance with yet another feature of the invention, each one of the filters comprising: a conductive layer; a dielectric disposed on the conductive layer; a resistive layer disposed over the dielectric; a conductive electrode disposed in electrical contact with a first portion of the resistive layer and providing the input node; and, a connector in electrical contact with a second portion of the resistive layer such second portion of the resistive layer being displaced from the first portion of the resistive layer, such connector passing through the dielectric and being in electrical contact with the first conductor.

With such an arrangement, a compact resistor-capacitor (R-C) network (i.e., R-C filter) is provided that connects to pairs of control electrodes, e.g., gate fingers, in each device. This compact R-C filter has successfully eliminated parasitic oscillations in several monolithic microwave integrated circuit (MMIC) power amplifiers. Due to its compact size, it can be easily incorporated in existing MMIC designs with little or no need for additional tuning of the design. The compact R-C filter effectively eliminates drive dependent subharmonic and spurious oscillations in pHEMT power amplifiers.

BRIEF DESCRIPTION OF THE DRAWING

These and other features of the invention as well as the invention itself, will become more readily apparent from the following detailed description when taken together with the following drawings, in which:

FIG. 11 is an exploded view of a portion of the transistor device of FIG. 3, such exploded portion being enclosed by the arrow labelled 9—9 in FIG. 10;

FIG. 12 is a diagrammatical cross-sectional view of the portion of the transistor device of FIG. 11, such cross-section being taken along line 10—10 in FIG. 11;

DESCRIPTION OF THE PREFERRED EMBODIMENTS

Figure 1:
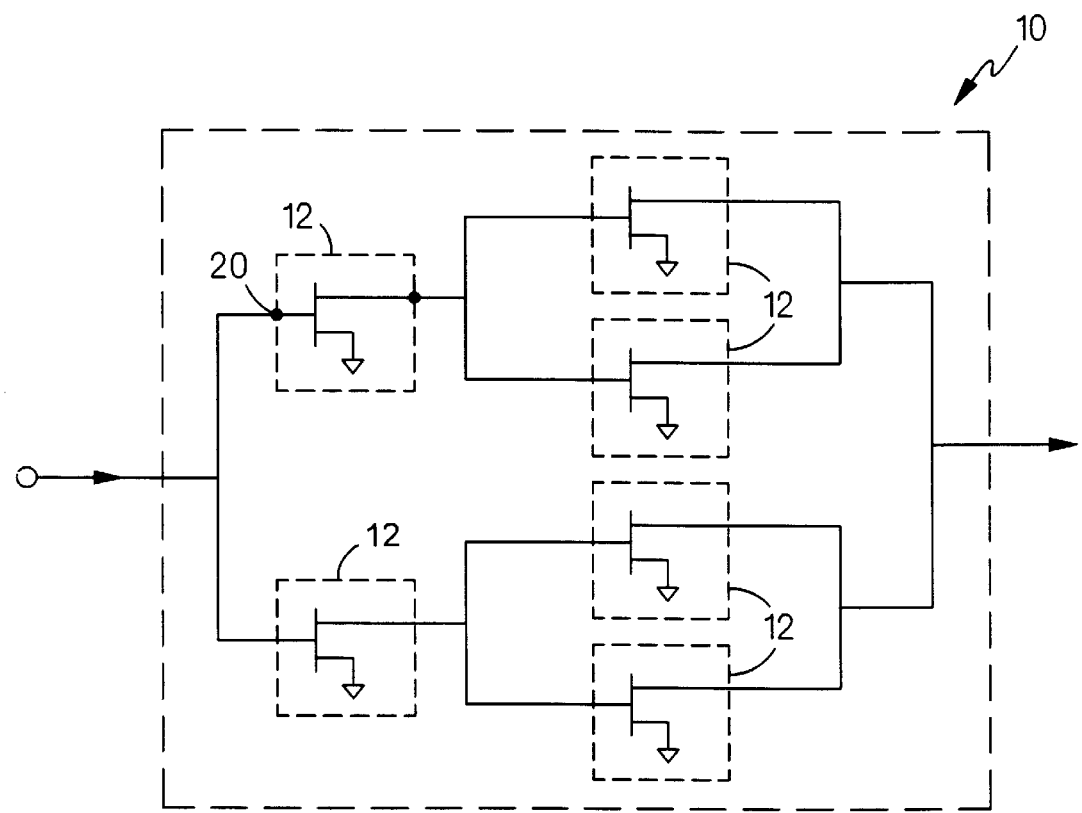
FIG. 1 is a schematic diagram of an amplifier according to the PRIOR ART.
Figure 2:
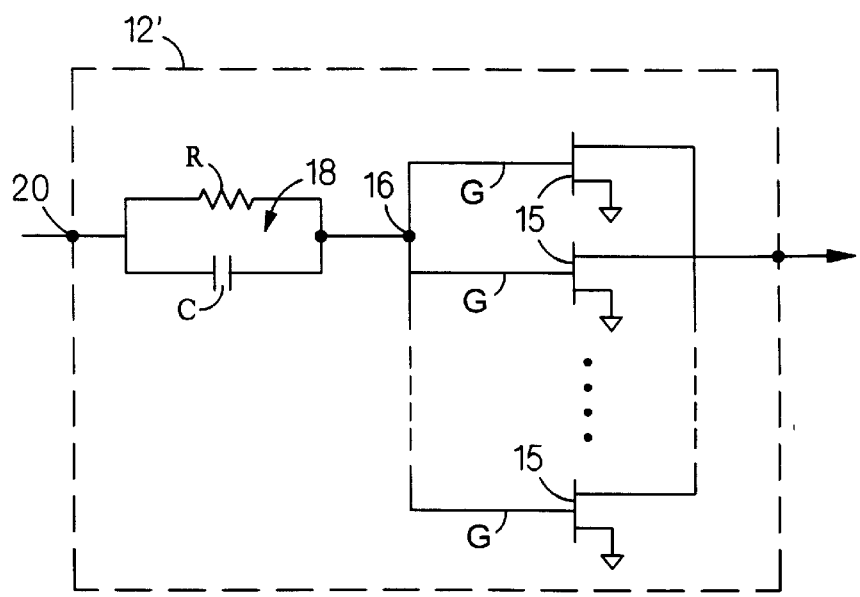
FIG. 2 is a schematic diagram of a transistor device according to the PRIOR ART and adapted for use in the amplifier of FIG. 1.
Figure 3:
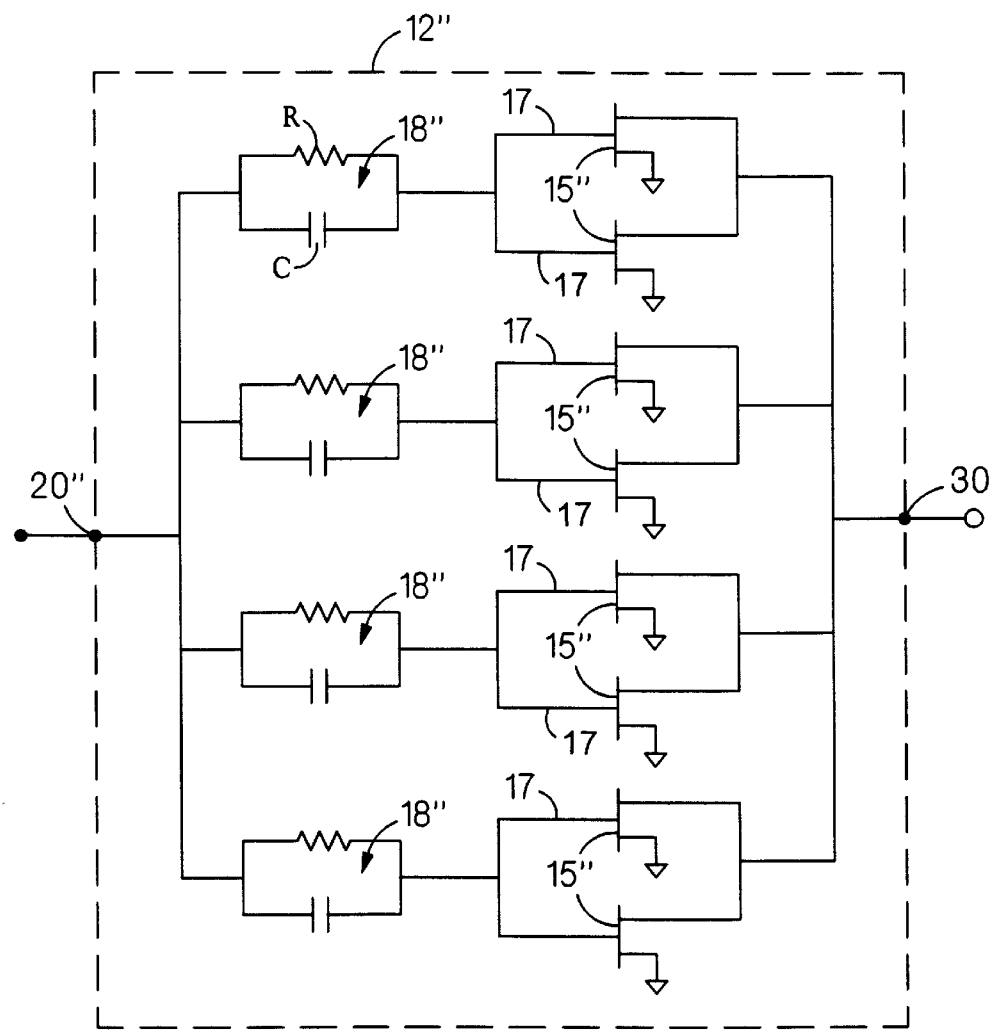
FIG. 3 is a schematic diagram of a transistor device according to the invention and adapted for use in the amplifier of FIG. 1.
Figure 4:
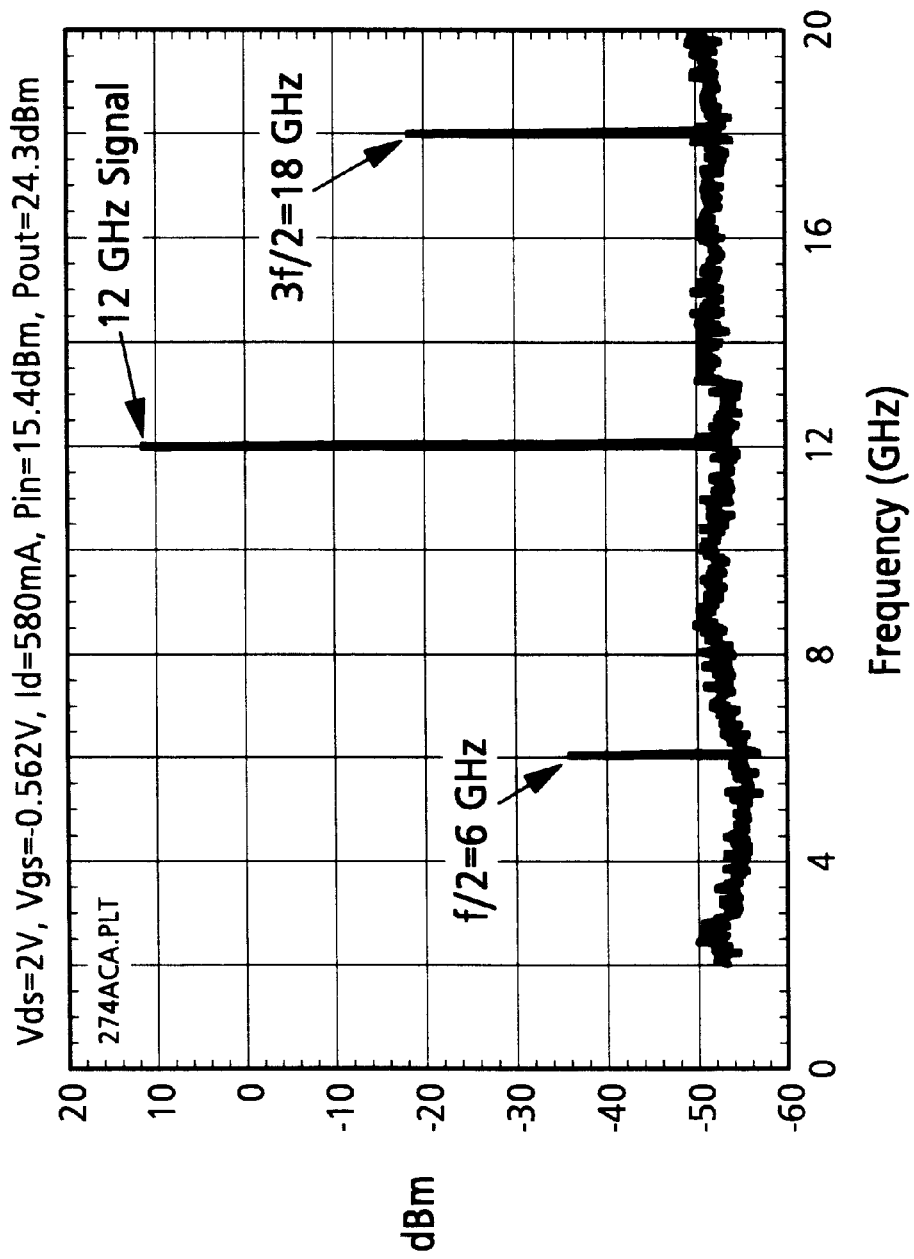
FIG. 4 is a plot showing subharmonic parasitic oscillation in the transistor devices used in the amplifier of FIG. 1 when such devices are operated at a drain-gate voltage (Vds) of 2 volts, a gate to source voltage (Vgs) of –0.562 volts, an input power Pin of 15.4 dBm and an input frequency $f_o$ of 12 GHz.
Figure 5:
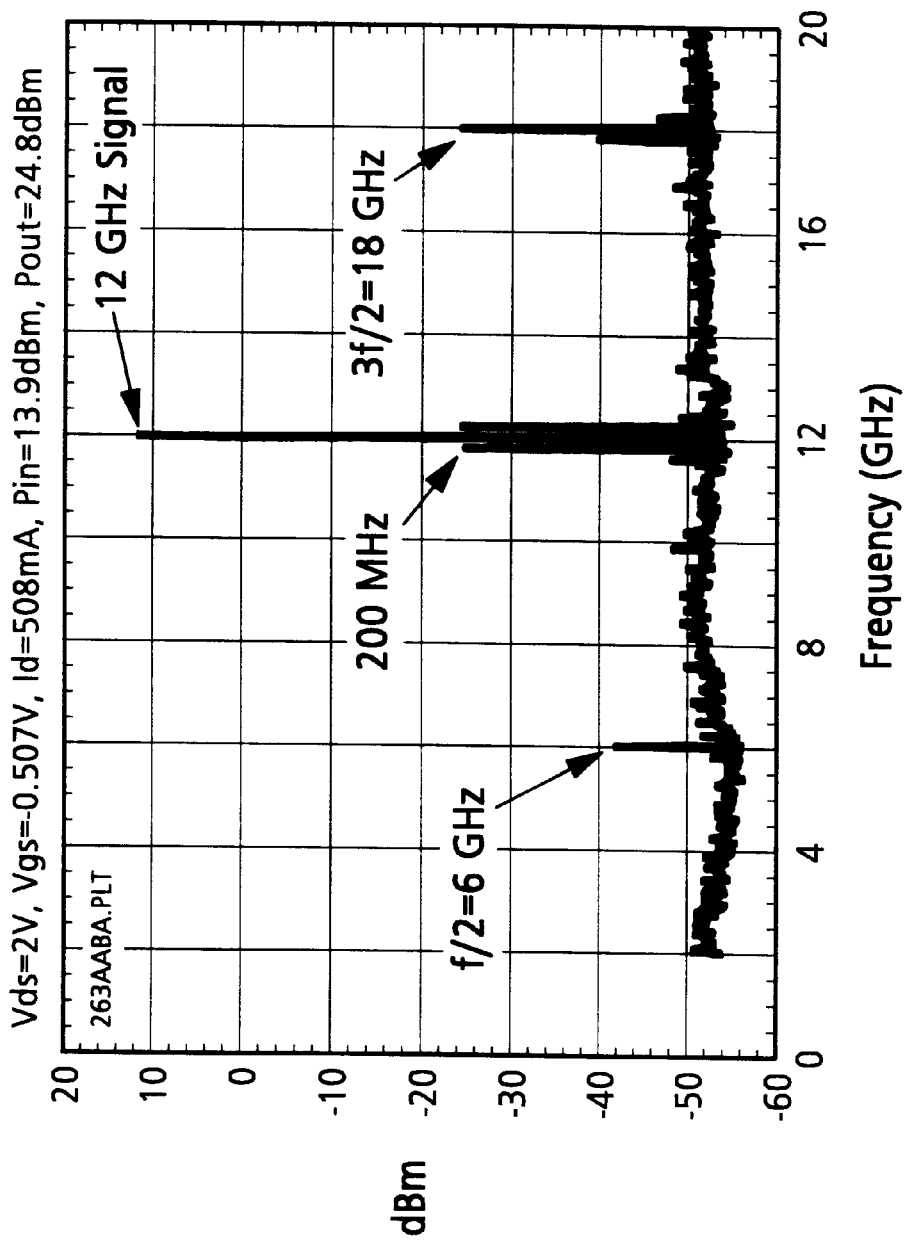
FIG. 5 is a plot showing spurious parasitic oscillation in the transistor devices used in the amplifier of FIG. 1 when such devices are operated at a drain-gate voltage (Vds) of 2 volts, a gate to source voltage (Vgs) of –0.507 volts, an input power Pin of 13.9 dBm and an input frequency $f_o$, of 12 GHz.
Figure 6:
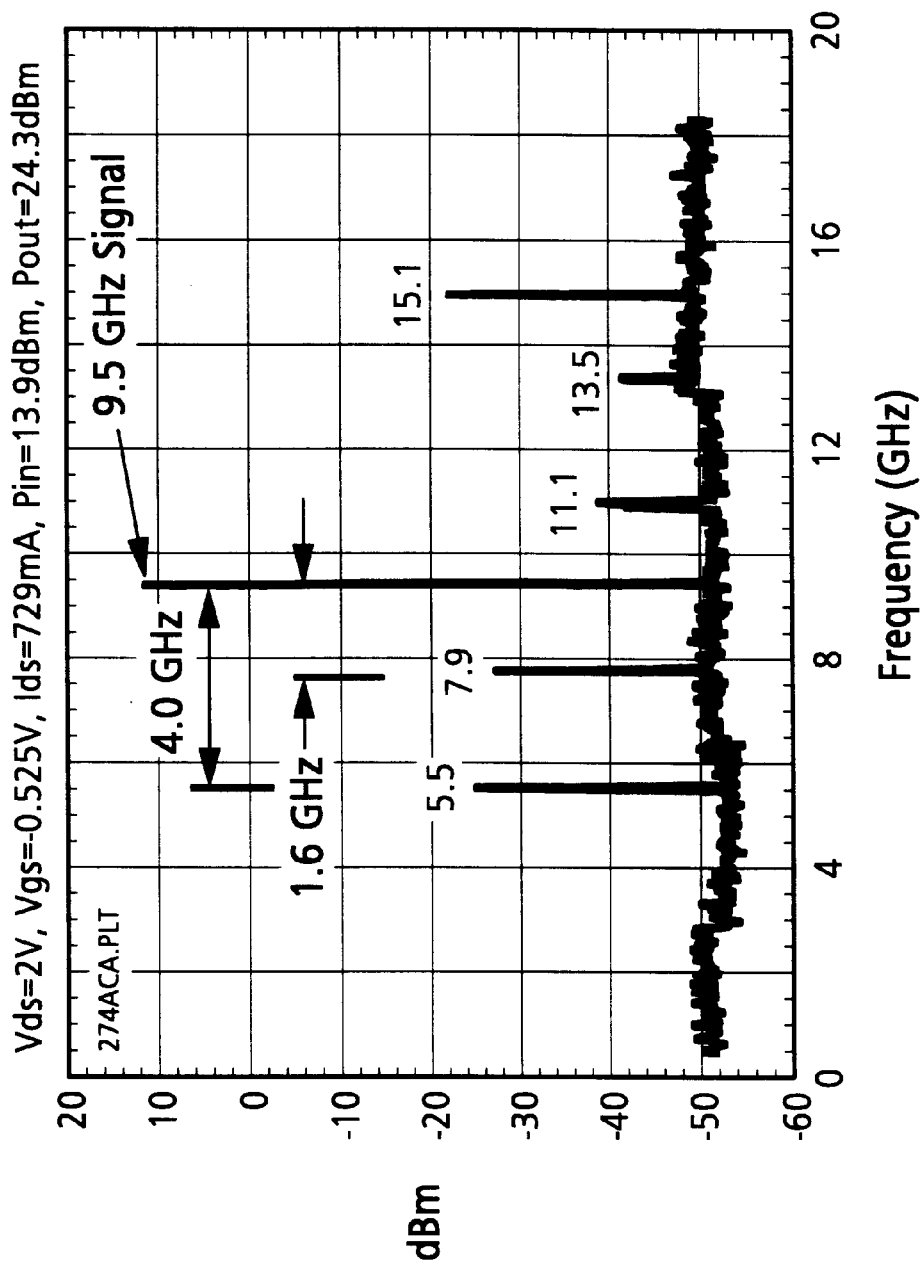
FIG. 6 is a plot showing spurious parasitic oscillation in the transistor devices used in the amplifier of FIG. 1 when such devices are operated at a drain-gate voltage (Vds) of 2 volts, a gate to source voltage (Vgs) of –0.525 volts, an input power Pin of 13.9 dBm and an input frequency $f_o$ of 9.5 GHz.
Figure 7:
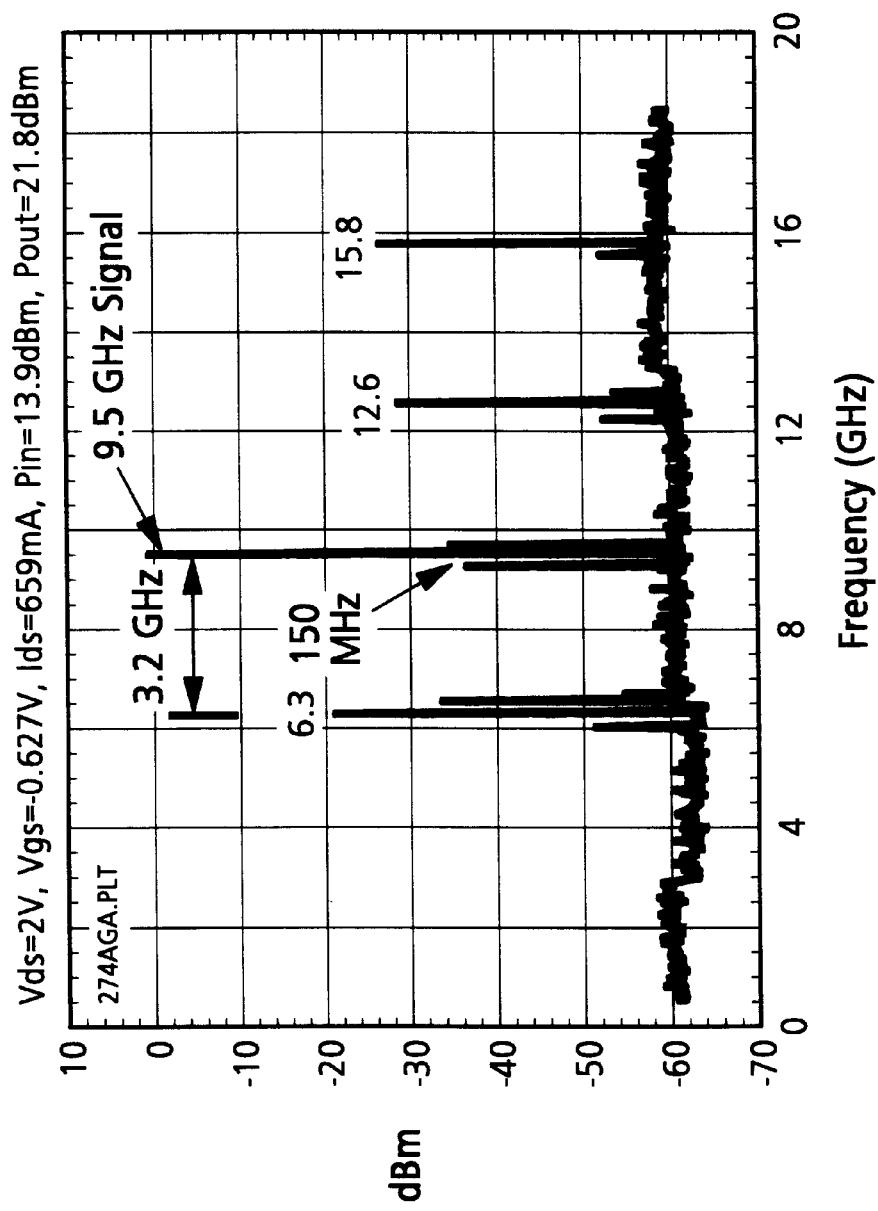
FIG. 7 is a plot showing spurious parasitic oscillation in the transistor devices used in the amplifier of FIG. 1 when such devices are operated at a drain-gate voltage (Vds) of 2 volts, a gate to source voltage (Vgs) of –0.627 volts, an input power Pin of 13.9 dBm and an input frequency $f_o$ of 9.5 GHz.
Figure 8:
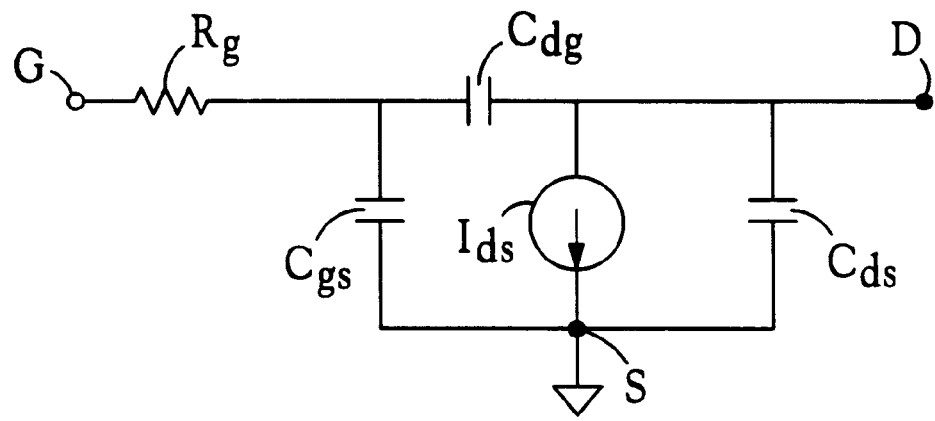
FIG. 8 is schematic diagram of a simplified FET model equivalent circuit according to the PRIOR ART.
Figure 9:
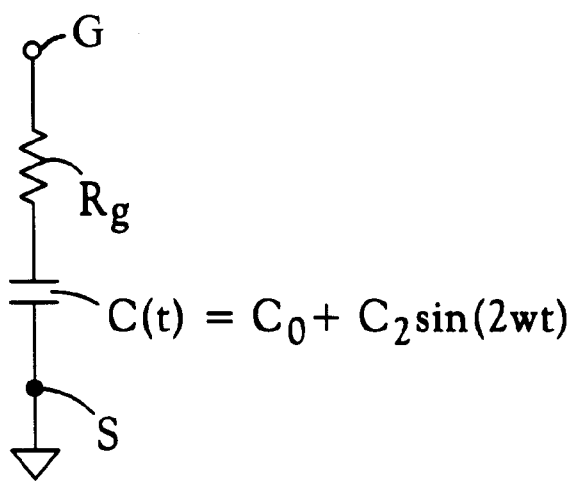
FIG. 9 is a schematic diagram of the effective input impedance of the FET model of FIG. 8 according to the PRIOR ART.

Referring now to FIG. 3, a transistor device 12" is shown adapted for use in the amplifier of FIG. 1 in place of the transistor device 12 used in such amplifier. The transistor device 12" includes a plurality of transistor cells, here eight cells 15". The cells 15" are formed in the active region of a semiconductor, here for example, a gallium arsenide semiconductor. Each one of the cells 15" includes a control electrode 17, for example the gate electrode where the cell is a FET, disposed between the source and drain regions or the base electrode, where the cell is a bipolar transistor, disposed between the emitter and collector regions. Thus, with either the FET or bipolar transistor the control electrode 17 (gate or base) controls the flow of carriers in the active region between the a pair of regions (source-drain or emitter-collector) in the active region.

The transistor device 12" includes an input node 20". Each one of the control electrodes 17 is coupled to the input node 20" through a R-C filter 18". Here, each pair of the control electrodes 17 share one of the R-C filter 18". Thus, here, in this example, there are four R-C filters 18". Here, the transistor devices 15" are FETs with source electrodes connected to ground and drain electrodes connected to output node 30.

Figure 12A:
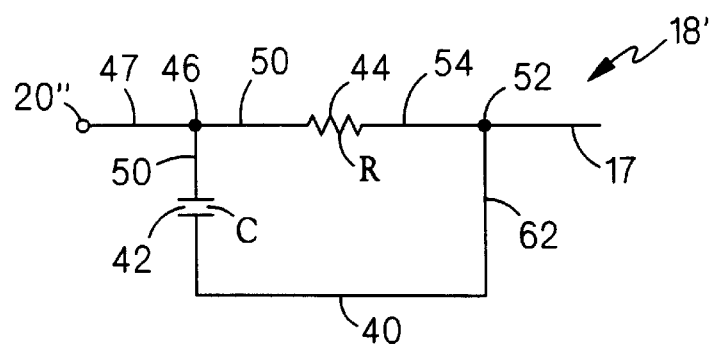
FIG. 12A is a schematic diagram of an R-C filter used by the transistor device of FIG. 3.
Figure 12B:
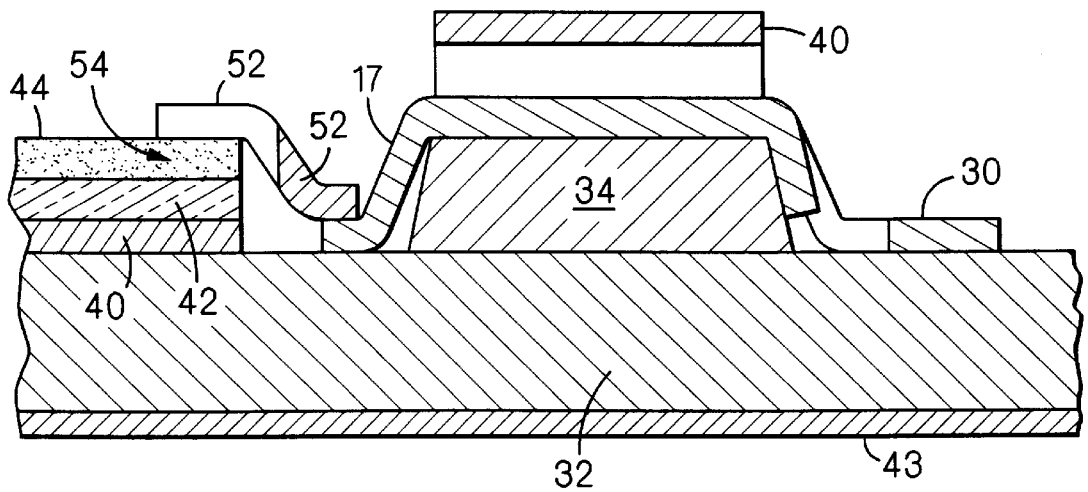
FIG. 12B is diagrammatical cross-sectional view of the portion of the transistor device of FIG. 11, such cross-section being taken along line 10B—10B in FIG. 11.
Figure 13:
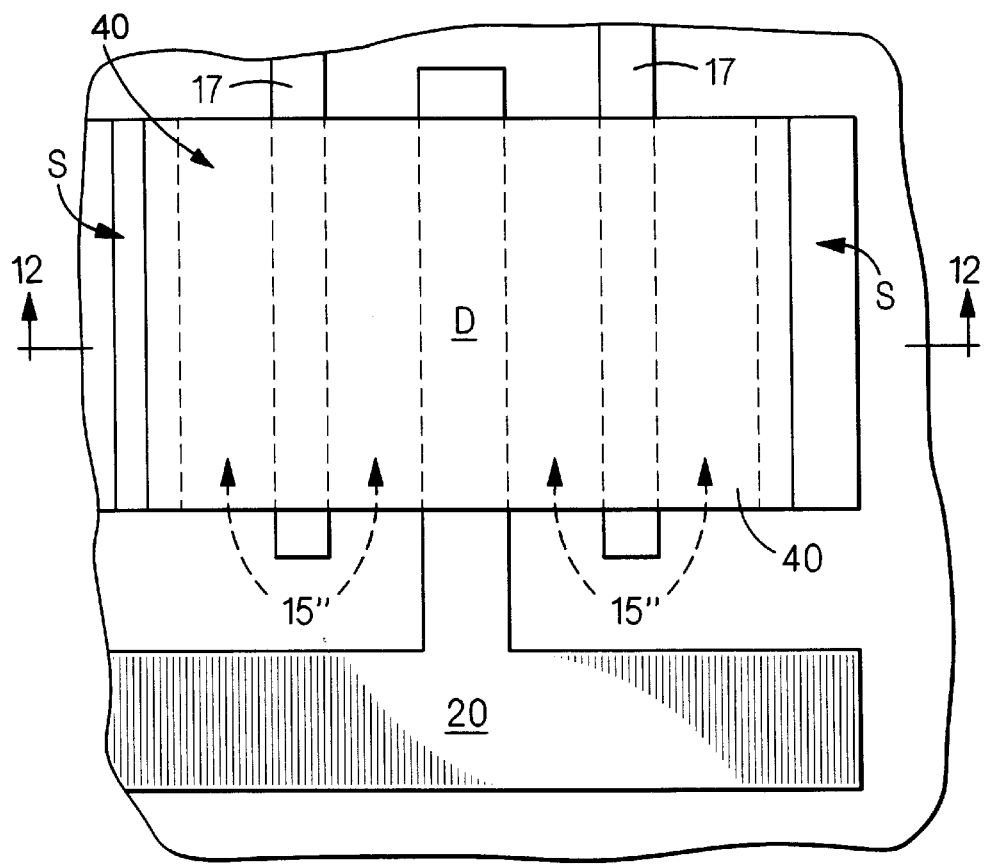
FIG. 13 is an exploded view of a portion of the transistor device of FIG. 10, such exploded portion being enclosed by the arrow labelled 11—11 in FIG. 10.
Figure 14:
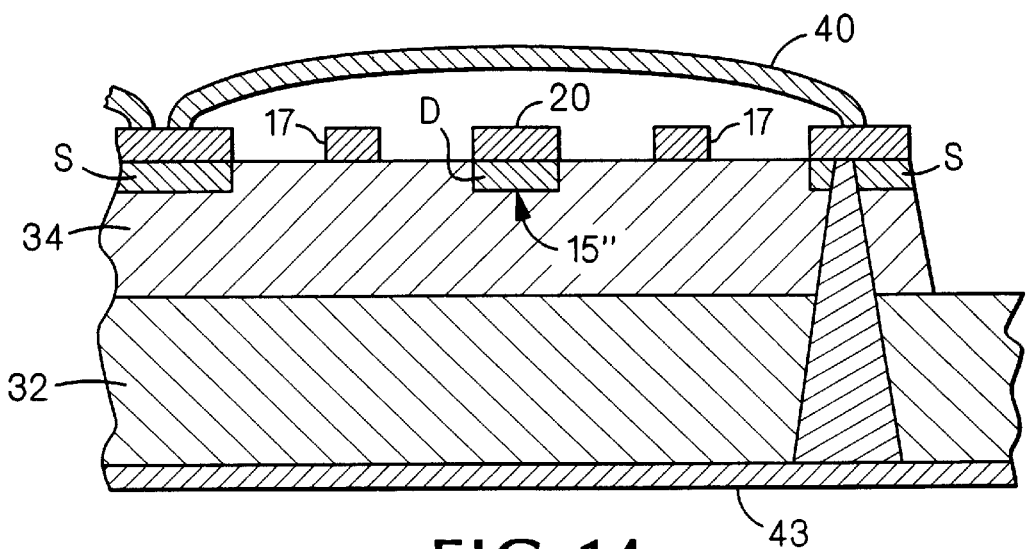
FIG. 14 is a diagrammatical cross-sectional view of the portion of the transistor device of FIG. 13, such cross-section being taken along line 12—12 in FIG. 13.

Referring now to FIGS. 10–14, the transistor device 12" is shown. The device 12" is formed on a semi-insulating III-V, here gallium arsenide substrate 32 (FIGS. 12, 12B, and 14). The device 12" includes the input node 20", the plurality of, here eight, transistor cells 15", and the plurality of, here four, R-C filters 18". Each one of the cells 15" is formed in a common, mesa-shaped active region 34 (FIGS. 12, 12B, and 14) on the substrate 32. Each one of the transistor cells 15" is here a FET having a finger-like gate electrode 17 (i.e., control electrode) disposed between a source region S, and a drain region, D. Thus, the gate electrode 17 is used to control the flow of carriers between the source S and drain D regions. Referring particularly to FIGS. 13 and 14, it is noted that the source regions S are in ohmic contact with source contacts and these are electrically interconnected by an air-bridge conductor 40, as shown most clearly in FIGS. 12, 12B, and 14. The source regions S are connected to a ground plane conductor 43 disposed on the opposite surface of the substrate 32 as shown most clearly in FIGS. 12B and 14.

Figure 10:
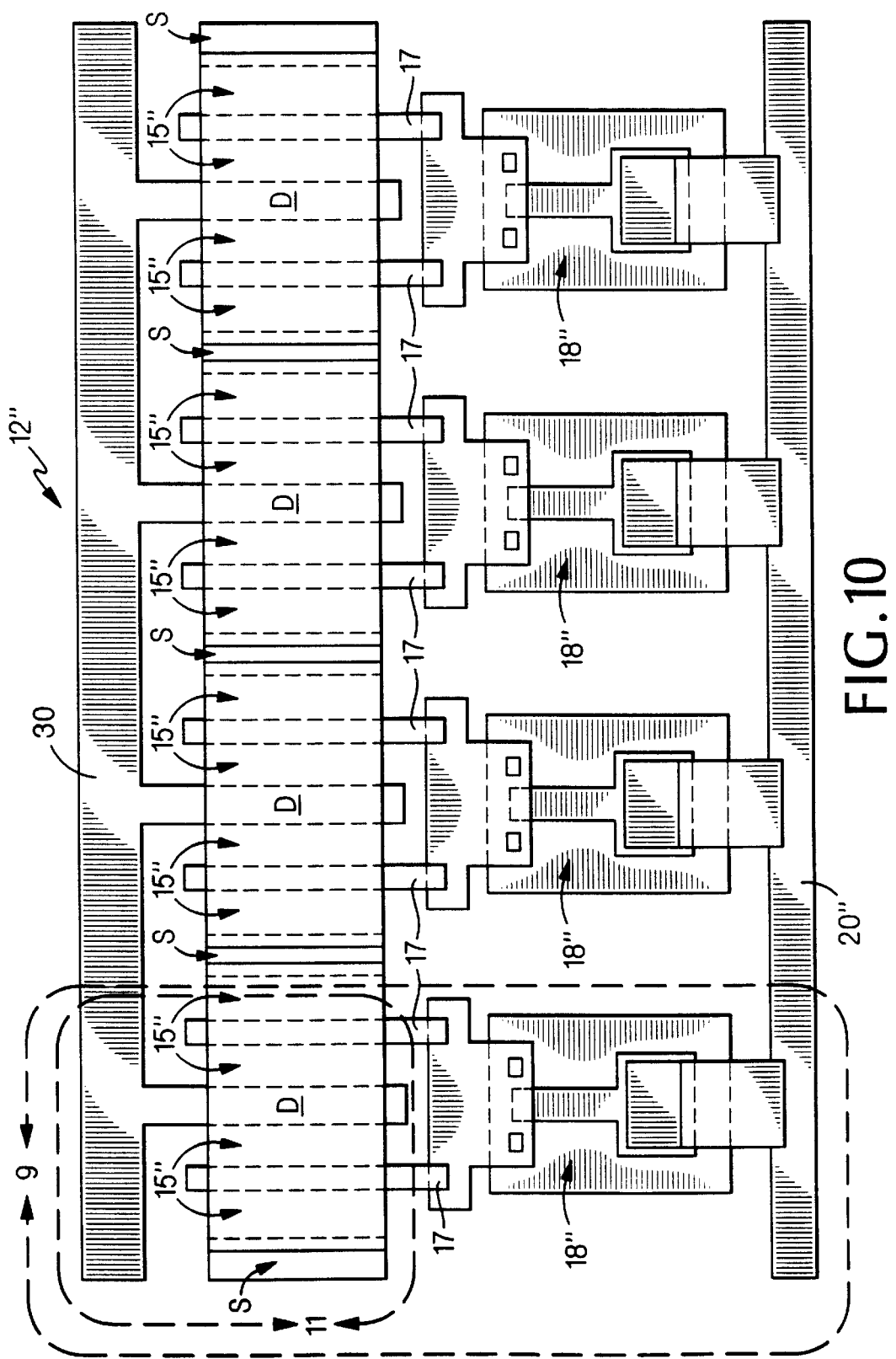
FIG. 10 is a diagrammatical plan view of the transistor device of FIG. 3.

Referring to FIGS. 10, 11, and 12, it is first noted that each of the R-C filters 18" is identical in construction. An exemplary one thereof is shown in detail in FIGS. 11, 12, and 12B. Thus, such filter 18" includes a conductive layer 40 disposed on the surface of the substrate 32. The conductive layer 40 is here gold. A dielectric layer 42, here silicon nitride, is formed on the conductive layer 40, as shown. A resistive layer 44, here tantalum, is disposed over the dielectric layer 42. A conductive plate or electrode 46, here gold, is disposed in electrical contact with a first portion 50 of the resistive layer 44. An electrical connector 52, here gold, is in electrical contact with a second portion 54 of the resistive layer 44, such second portion 54 of the resistive layer 44 being displaced from the first portion 50 of the resistive layer 44. The distance between the portions 50, 52 of the resistive layer 44 provides the resistor R of the R-C filter 18". The conductor layer 40 provides one plate, or electrode of the capacitor C of the R-C filter 18", the other plate of the capacitor C is provided by the conductive plate 46 and the resistive layer 44. The dielectric of the capacitor C is provided by the dielectric layer 42 disposed between the resistive layer 44 and the plate 40. The portion 54 of the resistive layer 44 is electrically connected to: connector 52, as described; to the conductive layer 40 by a conductive via 62 (FIG. 12) which passes through the resistive layer 44 and the dielectric layer 42; and, to an end of the control electrode 17 (FIG. 12B) through the connector 52. Thus, the conductive via 62 (FIG. 12) electrically connects the portion 54 of the resistive layer 44 to the lower plate of the capacitor C provided by the conductive layer 40. The resulting R-C filter 18" is shown in FIG. 12A. The plate 46 of the capacitor is connected to input node 20" by an air-bridge conductor 47 as shown in FIGS. 11, 12 and 12A. As noted above, each one of the R-C filters 18" comprises a resistor R and a capacitor C, the resistor R and the capacitor C being connected in parallel between the input node 20" and the corresponding one of the control electrodes 17 (FIGS. 12 and 12B). The resistive layer 44 serves both as the resistor layer of the resistor R (here, for example, 6 ohms/sq) and the top plate, or electrode of the capacitor, C. In order to minimize the size of the R-c filter 18", the tantalum resistive layer 44 layer serves both as the resistive layer to provide the resistor R and as part of the upper plate or electrode of the capacitor, C. At low frequencies, the filter 18" sees only the resistor, R. In the operating frequency band, however, the capacitor, C, begins to short out the resistor, R, so that the gain is not degraded too much.

We found a resistance of 10 ohms per pair of gate fingers 17 to be adequate. The capacitance, C, was chosen so that the capacitive reactance was equal to the resistance at the low end of the band. For our case, using 1.67 pF per pair of gate fingers 17 placed the 3 dB frequency of the R-C at 9.5 GHz.

In a typical power amplifier, there will be 30 to 50 compact R-C filters in parallel as opposed to 4 to 8 filters using the conventional approach. We believe the conventional approach is less effective at eliminating spurious oscillations as the size of the cell 12 increases as compared to our invention. In order to assure stability, performance of the conventional approach would degrade much more than according to our invention.

Other embodiments are within the spirit and scope of the appended claims. For example, while each filter 18" is connected to a pair of control electrodes 17, a filter 18" may be connected to only one control electrode 17 in which case the device 12" in FIG. 3 would have 8 filters 18".

What is claimed is:

1. A transistor device comprising:

a plurality of transistor cells, each one having a control electrode for controlling a flow of carriers through a semiconductor;

an input node;

a plurality of filters, each one of the filters being coupled between the input node and a corresponding one of the control electrodes of the plurality of transistor cells;

wherein the semiconductor provides a common active region for the plurality of transistor cells; and wherein each one of the filters comprises a resistor and a capacitor, the resistor and the capacitor being connected in parallel between the input node and the corresponding one of the control electrodes.

2. The transistor device recited in claim 1 wherein pairs of the control electrodes are connected to a common region and wherein each one of the filters is coupled between the input node and a corresponding one of the common regions.

3. A transistor device comprising: a semiconductor;

a plurality of transistor cells formed in an active region of the semiconductor, each one of the cells having a control electrode disposed between a pair of regions and extending across the active region for controlling a flow of carriers through the active regions between the pair of regions;

an input node;

a plurality of filters, each one of the filters being coupled between the input node and a corresponding one of the control electrodes of the plurality of transistor cells, each one of the filters comprising:

a conductive layer;

a dielectric disposed on the conductive layer;

a resistive layer disposed over the dielectric;

a conductive electrode disposed in electrical contact with a first portion of the resistive layer and providing the input node;

a connector in electrical contact with a second portion of the resistive layer such second portion of the resistive layer being displaced from the first portion of the resistive layer, such connector passing through the dielectric and being in electrical contact with the first conductor.

4. The transistor device recited in claim 3 wherein pairs of the control electrodes are connected to a common region and wherein each one of the filters is coupled between the input node and a corresponding one of the common regions.

5. The transistor device recited in claim 3 wherein each one of the filters comprises a resistor and a capacitor, the resistor and the capacitor being connected in parallel between the input node and the corresponding one of the control electrodes.

6. The transistor device recited in claim 3 wherein each one of the filters comprises:

a resistor, such resistor being provided by the resistive layer; and a capacitor, such capacitor being provided by the conductive layer and the conductive electrode and the dielectric layer, the resistor and the capacitor being connected in parallel between the input node and the corresponding one of the control electrodes.

7. The transistor device recited in claim 5 wherein each one of the filters comprises a resistor and a capacitor, the resistor and the capacitor being connected in parallel between the input node and the corresponding one of the common regions.

* * * * *